United States Patent
Son et al.

(10) Patent No.: US 9,767,887 B2
(45) Date of Patent: Sep. 19, 2017

(54) MEMORY DEVICE, MEMORY MODULE INCLUDING THE SAME, AND MEMORY SYSTEM INCLUDING THE SAME

(71) Applicants: SAMSUNG ELECTRONICS CO., LTD., Suwon-si (KR); Seoul National University R&DB Foundation, Seoul (KR)

(72) Inventors: Young Hoon Son, Suwon-si (KR); Jung Ho Ahn, Suwon-si (KR); Seong Il O, Suwon-si (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 155 days.

(21) Appl. No.: 14/734,101

(22) Filed: Jun. 9, 2015

(65) Prior Publication Data

US 2016/0240242 A1    Aug. 18, 2016

(30) Foreign Application Priority Data

Feb. 13, 2015 (KR) ........................ 10-2015-0022303

(51) Int. Cl.
G11C 11/4094 (2006.01)
G06F 3/06 (2006.01)
(Continued)

(52) U.S. Cl.
CPC ........ *G11C 11/4094* (2013.01); *G06F 3/0604* (2013.01); *G06F 3/0659* (2013.01);
(Continued)

(58) Field of Classification Search
CPC . G11C 11/5642; G11C 11/4094; G11C 16/24; G11C 7/065
See application file for complete search history.

(56) References Cited

U.S. PATENT DOCUMENTS 6,226,215 B1    5/2001    Yoon
6,445,632 B2    9/2002    Sakamoto
(Continued)

FOREIGN PATENT DOCUMENTS

JP    2014-038678 A    2/2014
KR    10-0280449 B1    2/2001
(Continued)

OTHER PUBLICATIONS

Seongil, O., et al., "Row-buffer decoupling: A case for low-latency DRAM microarchitecture", IEEE, Computer Architecture (ISCA), 2014 ACM/IEEE 41st International Symposium on Jun. 14-18, 2014, total 15 pages.

*Primary Examiner* — Tuan T Nguyen
(74) *Attorney, Agent, or Firm* — Sughrue Mion, PLLC

(57) ABSTRACT

A memory device includes a first memory cell, a second memory cell, a precharge circuit, a sense amplifier, a switch circuit, and a controller. The first memory cell is connected to a first bit line, the second memory cell is connected to a second bit line, and the precharge circuit connected between the first bit line and the second bit line. The sense amplifier includes a first input terminal and a second input terminal. The switch circuit is connected to the first bit line and the first input terminal and to the second bit line and the second input terminal and is configured to control a connection between the first bit line and the first input terminal and a connection between the second bit line and the second input terminal in response to a switch signal. The controller is configured to generate the switch signal in response to a command.

16 Claims, 17 Drawing Sheets

(51) Int. Cl.
*G11C 11/4096* (2006.01)
*G11C 11/4091* (2006.01)
*G11C 7/10* (2006.01)
*G11C 11/4076* (2006.01)

(52) U.S. Cl.
CPC .......... *G06F 3/0673* (2013.01); *G11C 7/1063* (2013.01); *G11C 11/4076* (2013.01); *G11C 11/4091* (2013.01); *G11C 11/4096* (2013.01)

(56) References Cited

U.S. PATENT DOCUMENTS

| | | | |
|---|---|---|---|
| 6,646,905 B2 * | 11/2003 | Tada | G11C 11/22 365/145 |
| 7,050,351 B2 | 5/2006 | Halbert et al. | |
| 7,489,576 B2 | 2/2009 | Hirota et al. | |
| 7,692,986 B2 | 4/2010 | Kajigaya | |
| 8,050,108 B2 | 11/2011 | Shimogawa et al. | |
| 8,462,573 B2 | 6/2013 | Choi | |
| 2007/0237015 A1 * | 10/2007 | Maejima | G11C 11/5642 365/205 |
| 2009/0147596 A1 * | 6/2009 | Shiah | G11C 7/065 365/189.11 |
| 2011/0176356 A1 * | 7/2011 | Kajigaya | G11C 8/12 365/149 |
| 2012/0269009 A1 * | 10/2012 | Lin | G11C 7/12 365/189.06 |
| 2014/0376318 A1 * | 12/2014 | Ferrant | G11C 7/062 365/189.11 |

FOREIGN PATENT DOCUMENTS

| | | |
|---|---|---|
| KR | 10-0434482 B1 | 7/2004 |
| KR | 10-0583148 B1 | 5/2006 |

* cited by examiner

| CMD | /ISO |
|------|------|
| ACT1 | HIGH |
| ACT2 | HIGH |
| WR1  | LOW  |
| WR2  | HIGH |

MEMORY DEVICE, MEMORY MODULE INCLUDING THE SAME, AND MEMORY SYSTEM INCLUDING THE SAME

CROSS-REFERENCE TO RELATED APPLICATION

This application claims priority under 35 U.S.C. §119(a) from Korean Patent Application No. 10-2015-0022303 filed on Feb. 13, 2015, the disclosure of which is hereby incorporated by reference in its entirety.

BACKGROUND

1. Field

Systems, devices, and articles of manufacture consistent with the inventive concept relate to a memory device, and more particularly, to a memory device capable of decoupling an internal operation of a pair of bit lines from an internal operation of a bit line sense amplifier and re-coupling them together, a memory module including the same, and a memory system including the same.

2. Description of the Related Art

A memory cell array in dynamic random access memory (DRAM) has a plurality of bank structures to meet throughput, energy efficiency, and capacity demands. Only a single row at a time can be accessed due to the constraints of cost. Accordingly, it is necessary to deactivate a row that has been activated and to precharge a pair of bit lines in order to access another row. Time taken to precharge the pair of bit lines is similar to time taken to read data from the activated row. Therefore, determining when a row is activated and deactivated is critical to the throughput of DRAM.

With the increase of the number of banks in DRAM, the number of requests per bank decreases, which leads lack of information necessary for a DRAM controller to predict a subsequent request and determine whether to deactivate a row that has been activated. As a result, the accuracy of prediction decreases.

Widely used page management policies at present include an open-page policy, a close-page policy, and a hybrid page policy switching between the open-page policy and the close-page policy. However, each of these policies requires a memory controller to predict requests to determine whether to deactivate a row.

SUMMARY

According to an aspect of some exemplary embodiments of the inventive concept, there is provided a memory device including a first memory cell connected to a first bit line, a second memory cell connected to a second bit line, a precharge circuit connected between the first bit line and the second bit line, a sense amplifier including a first input terminal and a second input terminal, a switch circuit connected to the first bit line and the first input terminal and to the second bit line and the second input terminal, the switch circuit configured to control connection between the first bit line and the first input terminal and connection between the second bit line and the second input terminal in response to a switch signal, and a controller configured to generate the switch signal in response to a command.

According to an aspect of other exemplary embodiments of the inventive concept, there is provided a memory module including a printed circuit board (PCB) including a connection pin and a memory device mounted on the PCB. The memory device includes a first memory cell connected to a first bit line, a second memory cell connected to a second bit line, a precharge circuit connected between the first bit line and the second bit line, a sense amplifier including a first input terminal and a second input terminal, a switch circuit connected to the first bit line and the first input terminal and to the second bit line and the second input terminal, the switch circuit configured to control connection between the first bit line and the first input terminal and connection between the second bit line and the second input terminal in response to a switch signal, and a controller configured to generate the switch signal in response to a command input to the memory device through the connection pin.

According to an aspect of other exemplary embodiments of the inventive concept, there is provided a memory device including a first precharge bit line and a second precharge bit line that are configured to be precharged by a precharge circuit; a sense amplifier; a switch circuit comprising a plurality of isolation transistors that isolate the first precharge bit line and the second precharge bit line from the sense amplifier.

BRIEF DESCRIPTION OF THE DRAWINGS

The above and other aspects will become more apparent by describing in detail exemplary embodiments thereof with reference to the attached drawings in which.

DETAILED DESCRIPTION OF THE EXEMPLARY EMBODIMENTS

Figure 1:
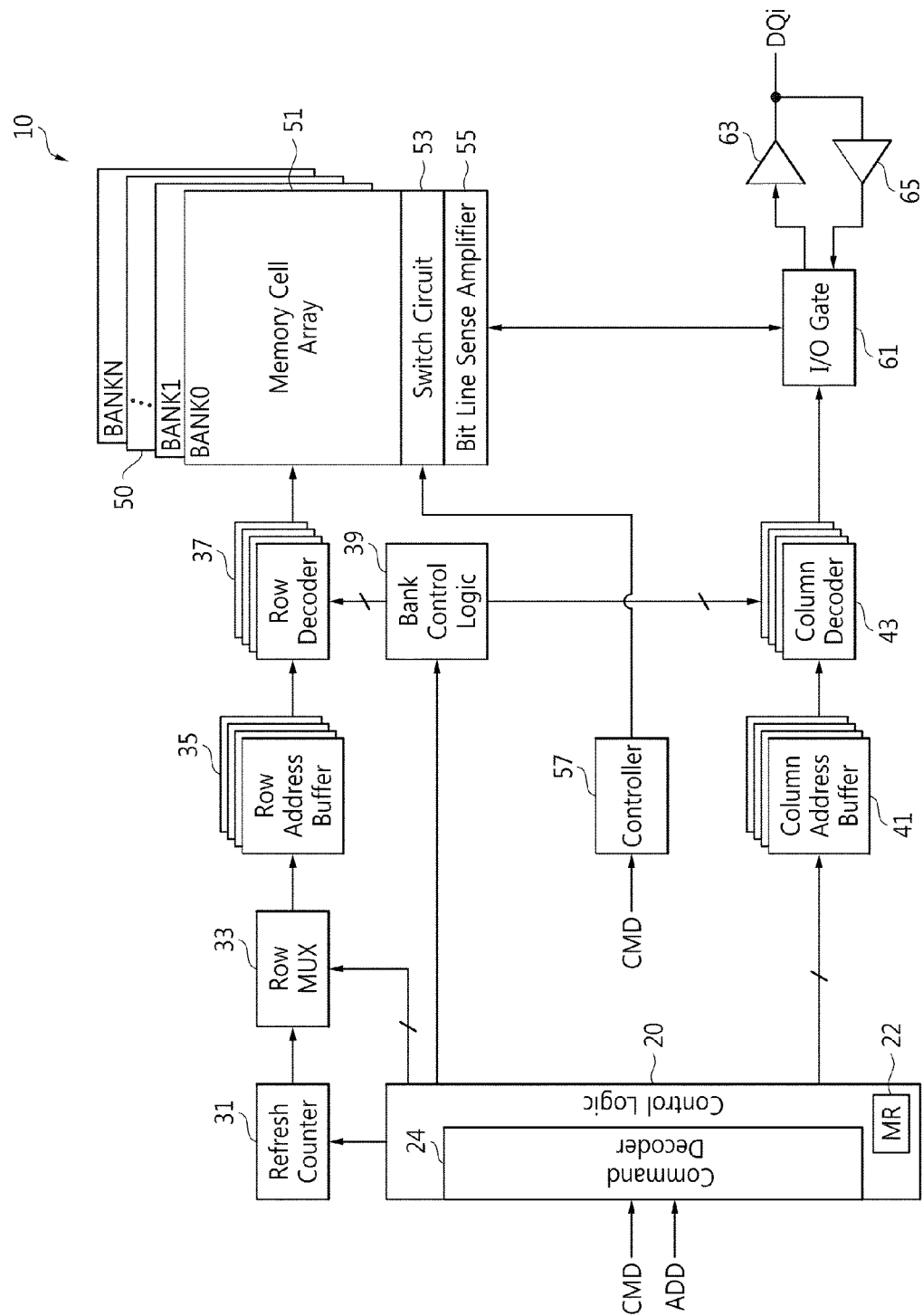
FIG. 1 is a schematic block diagram of a memory device according to some exemplary embodiments of the inventive concept.

The inventive concept now will be described more fully hereinafter with reference to the accompanying drawings, in which exemplary embodiments are shown. The inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms "first", "second", etc. may be used herein to describe various elements, these elements should not be limited by these terms. These terms are only used to distinguish one element from another. For example, a "first" signal could be termed a "second" signal, and, similarly, a "second" signal could be termed a "first" signal without departing from the teachings of the disclosure.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "includes" and/or "including," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of a memory device according to some exemplary embodiments of the inventive concept. A memory device 10 may be formed with volatile memory, e.g., dynamic random access memory (DRAM), but the inventive concept is not restricted to this example. The memory device 10 may include a control logic 20, a refresh counter 31, a row multiplexer (MUX) 33, a plurality of row address buffers 35, a plurality of row decoders 37, a bank control logic 39, a plurality of column address buffers 41, a plurality of column decoders 43, a plurality of banks 50, an input/output (I/O) gate 61, an output driver 63, and an input buffer 65.

The control logic 20 may control the refresh counter 31, the row multiplexer (MUX) 33, the bank control logic 39, and the plurality of column address buffers 41 in response to a command signal or a command CMD determined according to a plurality of signals and an address signal ADD. The command signal CMD may be determined according to the combination of a plurality of signals (e.g., a chip select (CS), a row address strobe (RAS), a column address strobe (CAS), and/or a write enable (WE)). The command signal CMD may be transmitted from a memory controller (not shown).

The address signal ADD may include address information of the target of operation, such as a bank (e.g., BANK0) or sub-blocks included in the bank BANK0, and/or address information of memory cells included in the bank BANK0 or the sub-blocks. The address information may be internally generated in the memory device 10 according to information set in a mode register (MR) 22 instead of being externally input, but the inventive concept is not restricted to this example. That is, the address information may be externally input in some exemplary embodiments.

The control logic 20 may include the MR 22 and a command decoder 24. The MR 22 may store information for controlling various operation modes, such as an active operation, a read operation, a write operation, and/or a refresh operation, of the memory device 10. The command decoder 24 may receive and decode the command signal CMD and may generate a command and/or an address for controlling each of the refresh counter 31, the row multiplexer (MUX) 33, the bank control logic 39, and the plurality of column address buffers 41 according to the decoding result. Although the command decoder 24 is provided within the control logic 20 as illustrated in FIG. 1, it may be provided outside the control logic 20 in some exemplary embodiments.

The refresh counter 31 may generate a row address in response to a refresh command output from the command decoder 24. The row address may include at least one signal.

The row MUX 33 may selectively output either a row address received from the refresh counter 31 or a row address received from the control logic 20 in response to a select signal (not shown) output from the control logic 20. When a read operation or a write operation is performed in the memory device 10, the row MUX 33 may selectively output a row address received from the control logic 20. When a refresh operation is performed in the memory device 10, the row MUX 33 may selectively output a row address received from the refresh counter 31. The control logic 20 may generate the select signal according to the operation mode of the memory device 10.

The row address buffers 35 may buffer a row address received from the row MUX 33. However, a plurality of the row address buffers 35 may be implemented as a single row address buffer in some exemplary embodiments.

A row decoder corresponding to a bank selected by the bank control logic 39 among the row decoders 37 may decode a row address received from a row address buffer 35 corresponding to the bank among the row address buffers 35.

However, a plurality of the row decoders 37 may be implemented as a single row decoder in some exemplary embodiments.

The bank control logic 39 may select one bank from among a plurality of banks 50 according to the control of the control logic 20. Alternatively, the control logic 20 may directly select one bank from among the banks 50.

Each of the column address buffers 41 may buffer a column address received from the control logic 20. However, a plurality of the column address buffers 41 may be implemented as a single column address buffer in some exemplary embodiments. A column decoder corresponding to a bank selected by the bank control logic 39 among the column decoders 43 may decode a column address output from a column address buffer corresponding to the bank among the column address buffers 41. However, a plurality of the column decoders 43 may be implemented as a single column decoder in some exemplary embodiments.

Each of the banks 50 may include a memory cell array 51, a switch circuit 53, and a bit line sense amplifier 55. The switch circuit 53 may include a plurality of switch circuits and the bit line sense amplifier 55 may include a plurality of switch circuits. The banks 50 may be formed in different layers or in one layer.

The memory cell array 51 may include a plurality of word lines (or a plurality of row lines), pairs of bit lines (or pairs of column lines), and memory cells that store data. As used in the present disclosure, the term "pair" denotes two. The switch circuit 53 may connect the pairs of bit lines to the bit line sense amplifier 55.

The memory device 10 may also include a controller 57 that controls the switch circuit 53. The controller 57 may control the switch circuit 53 to turn the switch circuit 53 on or off in response to the command signal CMD. The operation of the controller 57 will be described in detail with reference to FIG. 3 later.

The bit line sense amplifier 55 may sense and amplify signals output from a corresponding pair of bit lines to generate read data and may output the read data to the I/O gate 61. The bit line sense amplifier 55 may transmit write data from the I/O gate 61 to a corresponding pair of bit lines through the switch circuit 53. At this time, the bit line sense amplifier 55 may function as a write driver during a write operation.

During a read operation, the I/O gate 61 may transmit read data from the bit line sense amplifier 55 to the output driver 63 in response to column select signals output from one of the column decoders 43. During a write operation, the I/O gate 61 may transmit write data from the input buffer 65 to the bit line sense amplifier 55 in response to column select signals output from one of the column decoders 43.

The output driver 63 may output data received from the I/O gate 61 to an outside of the memory device 10. The input buffer 65 may transmit data received from an outside of the memory device 10 to the I/O gate 61.

Figure 2:
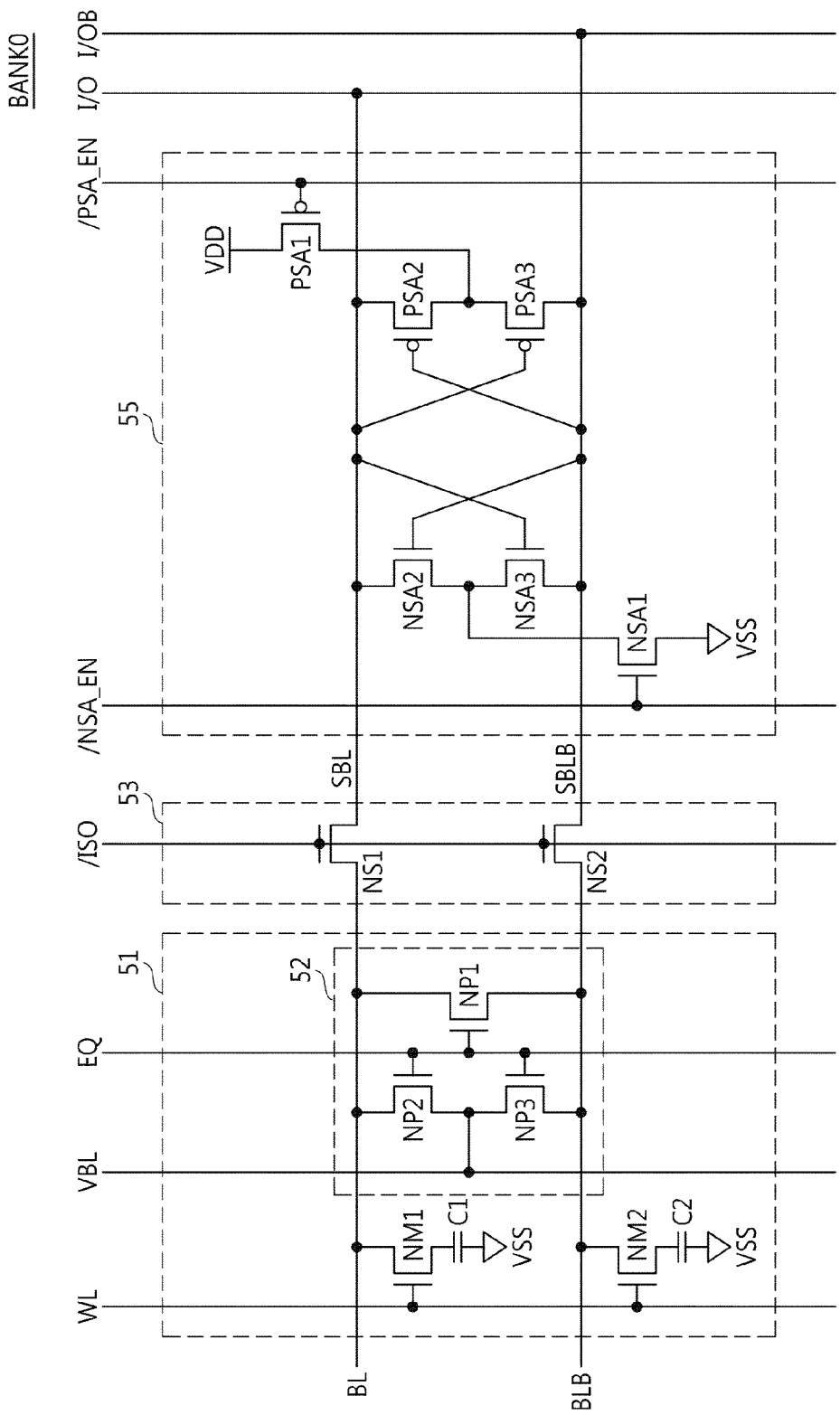
FIG. 2 is a schematic circuit diagram of a bank in the memory device illustrated in FIG. 1.

FIG. 2 is a schematic circuit diagram of a bank BANK0 in the memory device 10 illustrated in FIG. 1. Referring to FIGS. 1 and 2, the memory cell array 51 in the first bank BANK0 includes a first memory cell and a second memory cell.

The first memory cell includes a first capacitor C1 that stores first data and a first transistor NM1 that connects the first capacitor C1 to a bit line BL in response to a word line signal applied to a word line WL. The second memory cell includes a second capacitor C2 that stores second data and a second transistor NM2 that connects the second capacitor C2 to a complementary bit line BLB in response to the word line signal applied to the word line WL. The memory cell array 51 may include a precharge circuit 52 connected between a pair of the bit lines BL and BLB.

The precharge circuit 52 may include transistors NP1, NP2, and NP3 as shown in FIG. 2. The precharge circuit 52 may precharge the pair of the bit lines BL and BLB with a precharge voltage in response to a precharge enable signal EQ applied to a precharge enable line. The precharge voltage may be supplied from a precharge voltage supply line VBL. When the transistors NP1, NP2, and NP3 included in the precharge circuit 52 are switched on by the precharge enable signal EQ applied to the precharge enable line, the precharge voltage supplied from the precharge voltage supply line VBL may be applied to the pair of the bit lines BL and BLB. As a result, the pair of the bit lines BL and BLB are precharged with the precharge voltage. The precharge voltage may be the same as a power supply voltage VDD, or may be half of the power supply voltage VDD, i.e., VDD/2, but the inventive concept is not restricted to this example.

When the pair of the bit lines BL and BLB are connected to the bit line sense amplifier 55 by the switch circuit 53, the precharge circuit 52 may precharge the bit line sense amplifier 55 with the precharge voltage. Precharging the bit line sense amplifier 55 denotes precharging a pair of bit lines SBL and SBLB connected to the bit line sense amplifier 55. In other words, the precharge circuit 52 may precharge the pair of the bit lines SBL and SBLB.

The switch circuit 53 may perform a switching operation in response to a switch signal /ISO applied to a switch signal line by the controller 57. The switch circuit 53 is turned on in response to the switch signal /ISO that has been activated and is turned off in response to the switch signal /ISO that has been deactivated. The switch signal /ISO may be activated at one of a high level and a low level, and the switch signal /ISO may be deactivated at the other of the high level and the low level. For clarity of the description, it is assumed that the switch signal /ISO is activated at the high level and the switch signal /ISO is deactivated at the low level.

When the switch circuit 53 is turned on, the pair of the bit lines BL and BLB are connected with the pair of the bit lines SBL and SBLB of the bit line sense amplifier 55. When the switch circuit 53 is turned off, the pair of the bit lines BL and BLB are disconnected from the pair of the bit lines SBL and SBLB of the bit line sense amplifier 55. The switch circuit 53 may be formed with N-channel metal oxide semiconductor (NMOS) transistors NS1 and NS2, as shown in FIG. 2, but the inventive concept is not restricted to the current embodiments.

When the pair of the bit lines BL and BLB are disconnected from the pair of the bit lines SBL and SBLB of the bit line sense amplifier 55, the pair of the bit lines BL and BLB and the bit line sense amplifier 55 may be subjected to different operations. For instance, while the pair of the bit lines BL and BLB are being precharged, the bit line sense amplifier 55 may transmit data to or receive data from the I/O gate 61 through a pair of data I/O lines I/O and I/OB. As described above, the bit line sense amplifier 55 may function as a sense amplifier or a driver.

The bit line sense amplifier 55 may operate in response to at least one of bit line sense amplifier enable signals /PSA_EN and /NSA_EN applied to respective enable signal lines. The bit line sense amplifier 55 may include a plurality of NMOS transistors NSA1 through NSA3 and a plurality of P-channel MOS (PMOS) transistors PSA1 through PSA3.

The PMOS transistor PSA1 may be connected to the power supply voltage VDD to apply the power supply voltage VDD to a first node to allow the power supply voltage VDD to be applied to the bit line sense amplifier 55. The transistor NSA1 may be connected to a voltage VSS to apply the voltage VSS to a second node to allow the voltage VSS to be applied to the bit line sense amplifier 55. The voltage VSS may be a ground voltage.

For instance, when it is assumed that data "1" is transmitted through the bit line BL and data "0" is transmitted through the complementary bit line BLB, the NMOS transistor NSA3 and the PMOS transistor PSA2 are switched on. When the transistors PSA1 and NSA1 are switched on, the voltage VSS is applied to the complementary bit line BLB through the NMOS transistor NSA3 and the power supply voltage VDD is applied to the bit line BL through the PMOS transistor PSA2. Accordingly, the bit line BL is charged up to the power supply voltage VDD and the complementary bit line BLB is discharged down to the voltage VSS. As a result, the bit line sense amplifier 55 may amplify a voltage difference between the pair of the bit lines BL and BLB.

The bit line sense amplifier 55 outputs an amplified voltage difference (or signal) to the I/O gate 61 through the pair of the data I/O lines I/O and I/OB. The bit line sense amplifier 55 may write sensed and amplified signals to memory cells, respectively, connected to the pair of the bit lines BL and BLB, which is called a restore operation.

For the sake of convenience sake in the description, the bank BANK0 including two memory cells, one precharge circuit 52, one switch circuit 53, and one bit line sense amplifier 55 is illustrated in FIG. 2. However, this is only an example.

Figures 3A, 3B:
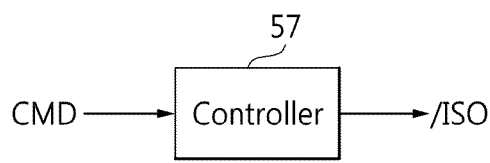
FIG. 3A is a schematic block diagram of a controller of the memory device illustrated in FIG. 1.
FIG. 3B is a table illustrating an operation of the controller of FIG. 3A.

FIG. 3A is a schematic block diagram of the controller 57 of the memory device 10 illustrated in FIG. 1. FIG. 3B is a table illustrating an operation of the controller 57 of FIG. 3A. Referring to FIGS. 1 through 3A, the controller 57 may receive the command signal CMD from a memory controller (not shown) and may output the switch signal /ISO for controlling the switch circuit 53 based on the command signal CMD.

Referring to FIGS. 1 through 3B, the command signal CMD may be a read active command ACT1 for a read operation, a write active command ACT2 for a write operation, a first write command WR1 followed by a write command on the same row, or a second write command WR2 not followed by a write command on the same row. The "same row" signifies one row when at least two consecutive commands are related with the one row. One row may include a plurality of memory cells.

When the command signal CMD is the read active command ACT1, the write active command ACT2, or the second write command WR2; the controller 57 may output the switch signal /ISO at a first level. For example, the first level may be a high level HIGH as shown in FIG. 3B. However, when the command signal CMD is the first write command WR1, the controller 57 may output the switch signal /ISO at a second level. For example, the second level may be a low level LOW as shown in FIG. 3B. In some exemplary embodiments, the first level and the second level may be defined differently according to a type of transistor implemented in the switch circuit 53.

Figure 4:
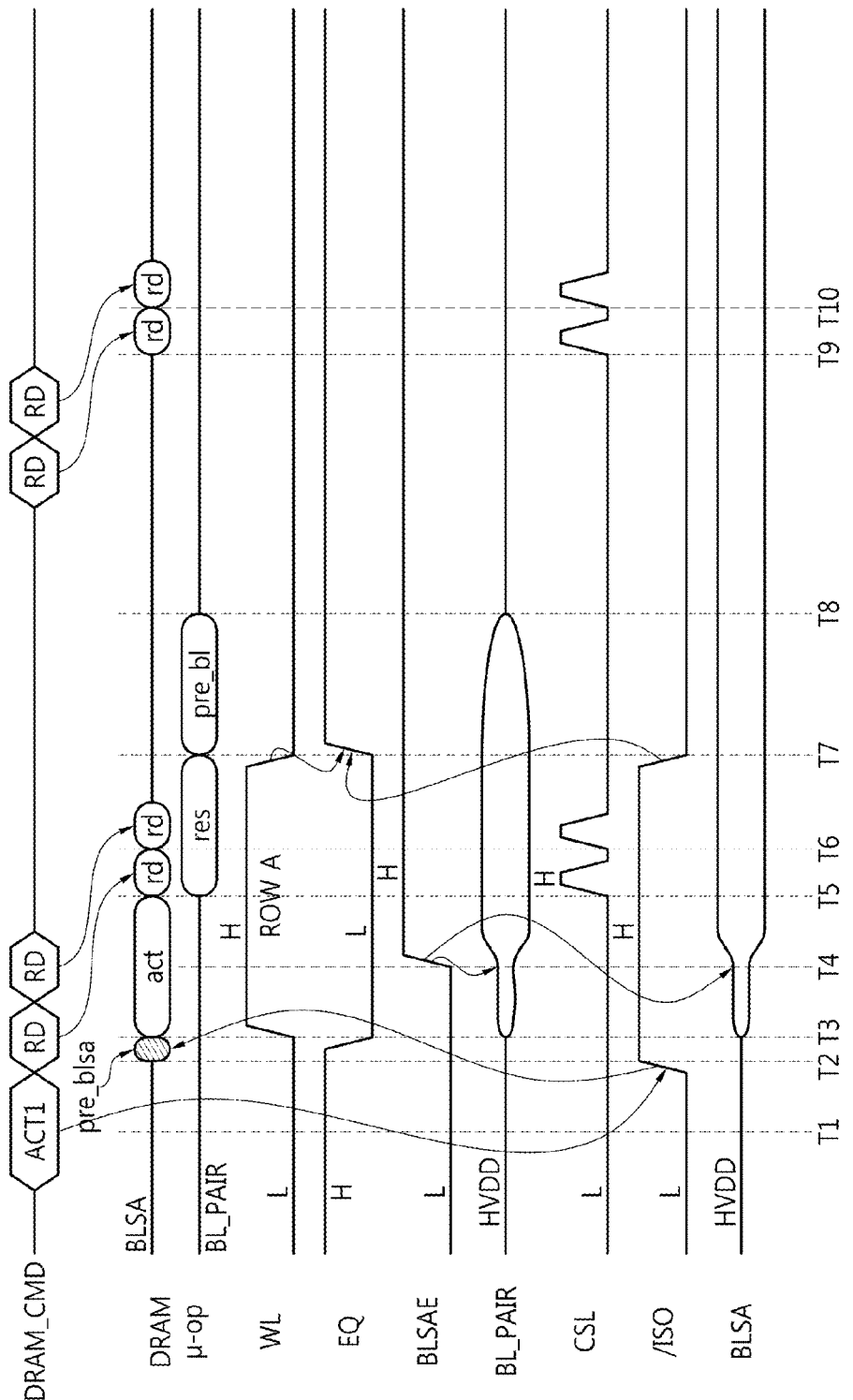
FIG. 4 is a timing chart showing a read operation of the memory device illustrated in FIG. 1 according to some exemplary embodiments of the inventive concept.

FIG. 4 is a timing chart showing the read operation of the memory device 10 illustrated in FIG. 1 according to some exemplary embodiments of the inventive concept. Reference characters appearing in FIGS. 4 through 6 will be described first.

"DRAM_CMD" denotes the command signal CMD received by the control logic 20 and the controller 57. "BLSA" denotes the bit line sense amplifier 55. "BL_PAIR" denotes the pair of the bit lines BL and BLB. "DRAM ji-op" denotes an internal operation of the memory device 10, and more particularly, of the bit line sense amplifier BLSA and the bit line pair BL_PAIR. "BLSAE" denotes a bit line sense amplifier enable signal, and "CSL" denotes a column select signal.

"pre_blsa" denotes a precharge operation with respect to the bit line sense amplifier BLSA; "act" denotes a sensing and amplifying operation of the bit line sense amplifier BLSA; "rd" denotes a read operation performed in response to a read command RD; "res" denotes a restore operation on memory cells; "pre_bl" denotes a precharge operation on the bit line pair BL_PAIR; and "wr" (see FIG. 6) denotes a write operation performed in response to the first write command WR1 or the second write command WR2. Each of first through 16th time points T1 through T16 illustrated in the drawings may indicate a single time point or an interval between two time points.

Referring to FIGS. 1 through 4, the precharge circuit 52 may precharge the bit line pair BL_PAIR at the first time point T1 in response to the precharge enable signal EQ at a high level H. At this time, the controller 57 outputs the switch signal /ISO at a low level L, and therefore, the bit line sense amplifier BLSA is not precharged.

Although the bit line sense amplifier BLSA has already been precharged at the first time point T1 in the exemplary embodiments illustrated in FIG. 4, the bit line sense amplifier BLSA may not have been precharged when the memory device 10 executes a different command before executing the read active command ACT1. Although the bit line pair BL_PAIR and the pair of the bit lines SBL and SBLB of the bit line sense amplifier BLSA are precharged to half of the power supply voltage VDD, i.e., HVDD in the exemplary embodiments illustrated in FIG. 4; the bit line pair BL_PAIR and the bit line sense amplifier BLSA may be precharged to the power supply voltage VDD, or another voltage.

When the control logic 20 and the controller 57 receive the read active command ACT1, at the second time point T2 the controller 57 may output the switch signal /ISO at a high level H in response to the read active command ACT1. The switch circuit 53 may connect the bit line pair BL_PAIR to the bit line sense amplifier BLSA in response to the switch signal /ISO at the high level H.

As the bit line sense amplifier BLSA is connected with the bit line pair BL_PAIR, the bit line sense amplifier BLSA may be precharged by the precharge circuit 52. When the precharge of the bit line sense amplifier BLSA is completed, the precharge enable signal EQ transitions from the high level H to a low level L. As a result, the precharge operation ends.

As the word line signal WL transitions from a low level L to a high level H at the third time point T3 after the precharge operation ends, the bit line sense amplifier BLSA may sense and amplify data of memory cells connected to the bit line pair BL_PAIR. Since the word line signal WL corresponding to row A transitions from the low level L to the high level H in the embodiments illustrated in FIG. 4, data of memory cells connected to row A may be sensed and amplified.

When a bit line sense amplifier enable signal BLSAE transitions from a low level L to a high level H at the fourth time point T4 while the data of the memory cells are being sensed and amplified, the amplifying operation of the bit line sense amplifier BLSA is enabled so that the bit line sense amplifier BLSA senses and amplifies a voltage difference of the bit line pair BL_PAIR. Here, the bit line sense amplifier enable signal BLSAE collectively denotes the bit line sense amplifier enable signals /NSA_EN and /PSA_EN.

When the read command RD is received at the fifth time point T5 after the sensing and amplifying operation, the bit line sense amplifier BLSA may output an amplified signal to the I/O gate 61 through the pair of data I/O lines I/O and I/OB in response to the column select signal CSL. For instance, a restore operation may be performed to restore the data of the memory cells while the amplified signal is being output to the pair of data I/O lines I/O and I/OB. A circuit performing the restore operation is not illustrated in FIG. 2 in order to simplify the drawing.

During the restore operation, the bit line sense amplifier BLSA may output the amplified signal to the I/O gate 61 through the pair of data I/O lines I/O and I/OB at the sixth time point T6 in response to the column select signal CSL.

When the word line signal WL transitions from the high level H to the low level after the data of the memory cells is restored, the memory cells may be disconnected from the bit line pair BL_PAIR. Since the controller 57 outputs the switch signal /ISO at the low level L, the switch circuit 53 disconnects the bit line pair BL_PAIR from the bit line sense amplifier BLSA.

The precharge circuit 52 may precharge the bit line pair BL_PAIR at the seventh time point T7 in response to the precharge enable signal EQ transitioning from the low level L to the high level H. The precharging of the bit line pair BL_PAIR may be completed at the eighth time point T8.

Even though the bit line pair BL_PAIR has been precharged, the amplified signal may exist in the bit line sense amplifier BLSA. Therefore, when read commands RD for the same row are received (which is referred to as a "row-hit" hereinafter), at the ninth and tenth time points T9 and T10 the bit line sense amplifier BLSA may output the amplified signal to the I/O gate 61. In other words, in case of a row-hit, the bit line pair BL_PAIR may be completely precharged in the same period of time as a precharge time used in an open-page policy.

According to the open-page policy, the bit line sense amplifier BLSA remains in an enabled state even after the read command RD is executed. Therefore, in case of a row-hit, time taken for the memory device 10 to process the subsequent read command RD is substantially the same as or similar to an address access time (tAA).

According to a close-page policy, a restore operation of memory cells is performed after the read command RD is executed and then the bit line sense amplifier BLSA is disabled. Accordingly, in case of a row-hit, time taken for the memory device 10 to process the subsequent read command RD is substantially the same as or similar to the sum of time taken to activate the bit line sense amplifier BLSA, i.e., tRCD and tAA.

According to the exemplary embodiments of the inventive concept described above, the bit line sense amplifier BLSA remains in the enabled state while the switch circuit 53 is turned off and the bit line pair BL_PAIR is being precharged. Therefore, in case of a row-hit, time taken to process the subsequent read command RD is substantially the same as or similar to the tAA as in the open-page policy.

Figure 5:
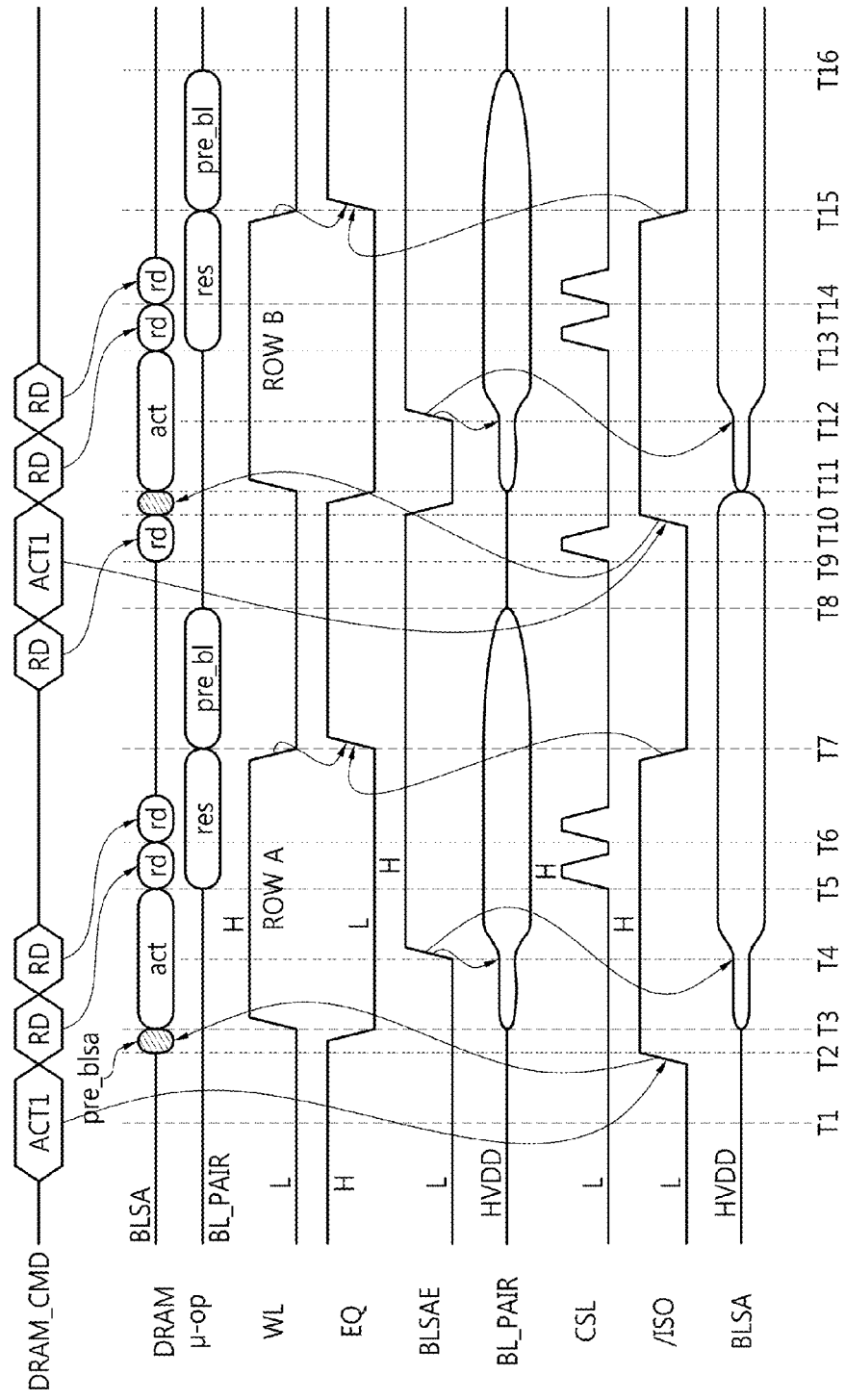
FIG. 5 is a timing chart showing a read operation of the memory device illustrated in FIG. 1 according to other exemplary embodiments of the inventive concept.

FIG. 5 is a timing chart showing the read operation of the memory device 10 illustrated in FIG. 1 according to other exemplary embodiments of the inventive concept. The operation of the memory device 10 from the first time point T1 to the ninth time point T9 illustrated in FIG. 5 is substantially the same as or similar to that of the memory device 10 from the first time point T1 to the ninth time point T9 illustrated in FIG. 4, and therefore, descriptions thereof will be omitted.

Referring to FIGS. 1 through 5, with reference to the WL line when a read command for a different row, i.e., row B is processed after a read command for row A is executed (which is referred to as a "row-miss" hereinafter), the control logic 20 and the controller 57 receives the read active command ACT1. At the tenth time point T10, the controller 57 may output the switch signal /ISO at the high level H in response to the read active command ACT1; the bit line sense amplifier enable signal BLSAE may transition from the high level H to the low level L; and the bit line sense amplifier BLSA may be disabled.

As a result, the switch circuit 53 connects the bit line pair BL_PAIR to the bit line sense amplifier BLSA in response to the switch signal /ISO at the high level H. As the bit line pair BL_PAIR is connected to the bit line sense amplifier BLSA, the bit line sense amplifier BLSA may be precharged by the precharge circuit 52. When the bit line sense amplifier BLSA is completely precharged, the precharge enable signal EQ transitions from the high level H to the low level L and the precharge operation ends.

As the word line signal WL transitions from the low level L to the high level H at the eleventh time point T11 after the precharge operation ends, the bit line sense amplifier BLSA may sense and amplify data of memory cells connected to the bit line pair BL_PAIR. Since the word line signal WL corresponding to row B transitions from the low level L to the high level H in the exemplary embodiments illustrated in FIG. 5, data of memory cells connected to row B may be sensed and amplified.

The bit line sense amplifier enable signal BLSAE transitions from the low level L to the high level H at the twelfth time point T12 while the data of the memory cells are being sensed and amplified. Accordingly, the amplifying operation of the bit line sense amplifier BLSA is enabled so that a voltage difference of the bit line pair BL_PAIR is sensed and amplified.

When the read command RD is received, at the 13th time point T13 after the sensing and amplifying operation the bit line sense amplifier BLSA may output an amplified signal to the I/O gate 61 through the pair of data I/O lines I/O and I/OB in response to the column select signal CSL. A restore operation may be performed to restore the data of the memory cells while the amplified signal is being output to the pair of data I/O lines I/O and I/OB.

During the restore operation, the bit line sense amplifier BLSA may output the amplified signal to the I/O gate 61 through the pair of data I/O lines I/O and I/OB at the 14th time point T14 in response to the column select signal CSL.

When the word line signal WL transitions from the high level H to the low level after the data is restored, the memory cells may be disconnected from the bit line pair BL_PAIR. Since the controller 57 outputs the switch signal /ISO at the low level L, the switch circuit 53 disconnects the bit line pair BL_PAIR from the bit line sense amplifier BLSA.

The precharge circuit 52 may precharge the bit line pair BL_PAIR at the 15th time point T15 in response to the precharge enable signal EQ transitioning to the high level H. The precharging of the bit line pair BL_PAIR may be completed at the 16th time point T16.

According to the exemplary embodiments of the inventive concept, the bit line pair BL_PAIR has already been precharged in a previous read operation, and therefore, in case of a row-miss, the memory device 10 may precharge only the bit line sense amplifier BLSA according to the read active command ACT1. Accordingly, time taken to execute the subsequent read command RD may be nearly the same as the time taken in the close-page policy.

According to the open-page policy, the bit line sense amplifier BLSA is kept enabled even after the read command RD is executed. Therefore, in case of a row-miss, time taken for the memory device 10 to process the subsequent read command RD is substantially the same as or similar to the sum of precharge time (tRP), tRCD, and tAA.

According to the close-page policy, after the read command RD is executed, a restore operation of memory cells is performed and the bit line sense amplifier BLSA is disabled. Therefore, in case of a row-miss, time taken for the memory device 10 to process the subsequent read command RD is substantially the same as or similar to the sum of tRCD and tAA.

According to the exemplary embodiments of the inventive concept, the restore operation of the memory cell and the precharging of the bit line pair BL_PAIR are completed while the current read command RD is being executed. Therefore, in case of a row-miss, time taken for the memory device 10 to process the subsequent read command RD is substantially the same as or similar to the sum of time taken to precharge the bit line sense amplifier BLSA, i.e., tRCD and tAA. On the other hand, the time taken to precharge the bit line sense amplifier BLSA is relatively shorter than tRCD and tAA. Accordingly, in case of a row-miss, the time taken for the memory device 10 to process the subsequent read command RD is substantially the same as or similar to the time taken in the close-page policy.

Figure 6:
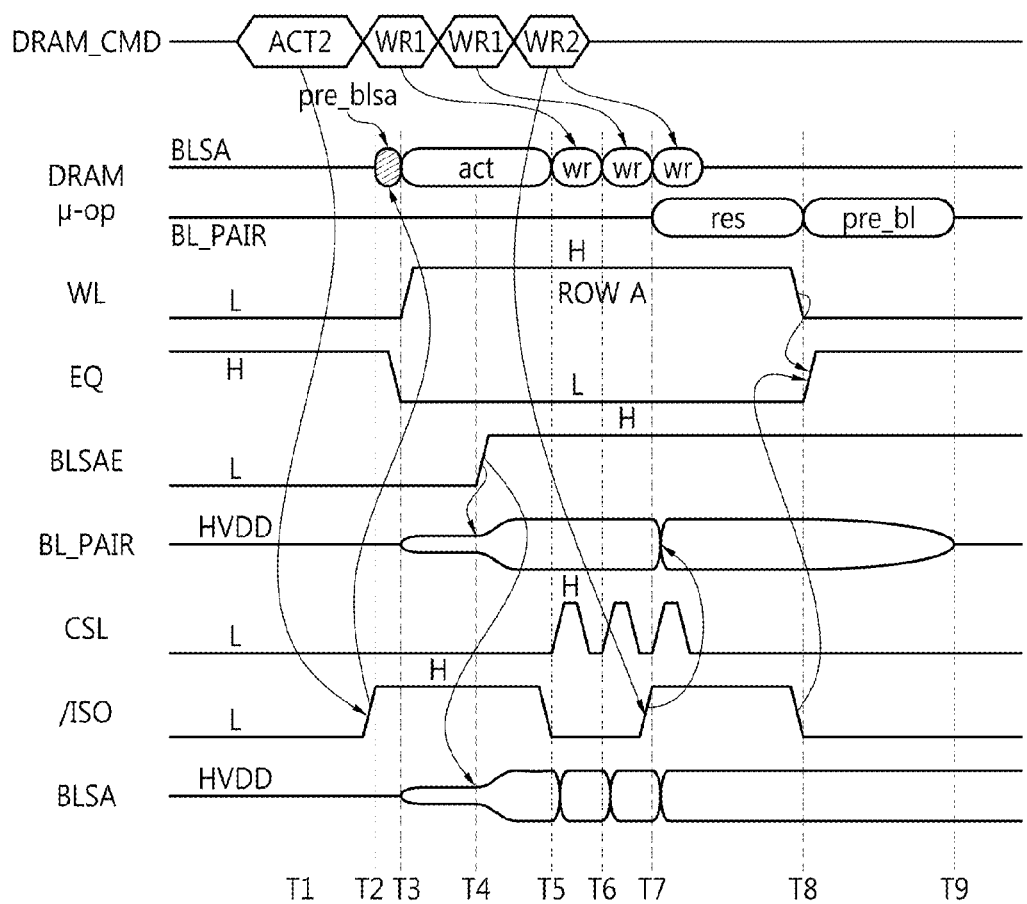
FIG. 6 is a timing chart showing a write operation of the memory device illustrated in FIG. 1 according to some exemplary embodiments of the inventive concept.

FIG. 6 is a timing chart showing a write operation of the memory device 10 illustrated in FIG. 1 according to some exemplary embodiments of the inventive concept. The operation of the memory device 10 from the first time point T1 to the fourth time point T4 illustrated in FIG. 6 is substantially the same as or similar to that of the memory device 10 from the first time point T1 to the fourth time point T4 illustrated in FIG. 4, and therefore, descriptions thereof will be omitted.

Referring to FIGS. 1 through 4 and FIG. 6, after the amplifying operation of the bit line sense amplifier BLSA, the controller 57 may output the switch signal /ISO at the low level L prior to the second time point T2 and the bit line pair BL_PAIR may be disconnected from the bit line sense amplifier BLSA by the switch circuit 53.

After the bit line pair BL_PAIR is disconnected from the bit line sense amplifier BLSA, the bit line sense amplifier BLSA may receive write data from the I/O gate 61 at the fifth time point T5 in response to a write command. The write command may be either the first write command WR1 or the second write command WR2. The first write command WR1 indicates a case in which a subsequent command is a row-hit. The second write command WR2 indicates a case in which a subsequent command is a row-miss.

When the control logic 20 and the controller 57 receive the first write command WR1, at the fifth time point T5 the switch signal /ISO transitions to the low level L. Accordingly, write data input to the bit line sense amplifier BLSA may not be transmitted to the bit line pair BL_PAIR and memory cells. When the control logic 20 and the controller 57 receive the first write command WR1 again, at the sixth time point T6 the write data in the bit line sense amplifier BLSA may be overwritten with data input to the bit line sense amplifier BLSA.

When the control logic 20 and the controller 57 receive the second write command WR2, at the seventh time point T7 the controller 57 outputs the switch signal /ISO at the high level H and the bit line pair BL_PAIR is disconnected from the bit line sense amplifier BLSA. Write data input to the bit line sense amplifier BLSA according to the second write command WR2 may be written to (or restored in) the memory cells through the bit line pair BL_PAIR.

After the write data is written to the memory cells, the word line signal WL and the switch signal /ISO transition from the high level H to the low level L at the eighth time point T8. The precharge enable signal EQ transitions from the low level L to the high level H and the precharge circuit 52 may precharge the bit line pair BL_PAIR. The bit line pair BL_PAIR may be completely precharged at the ninth time point T9.

Figure 7:
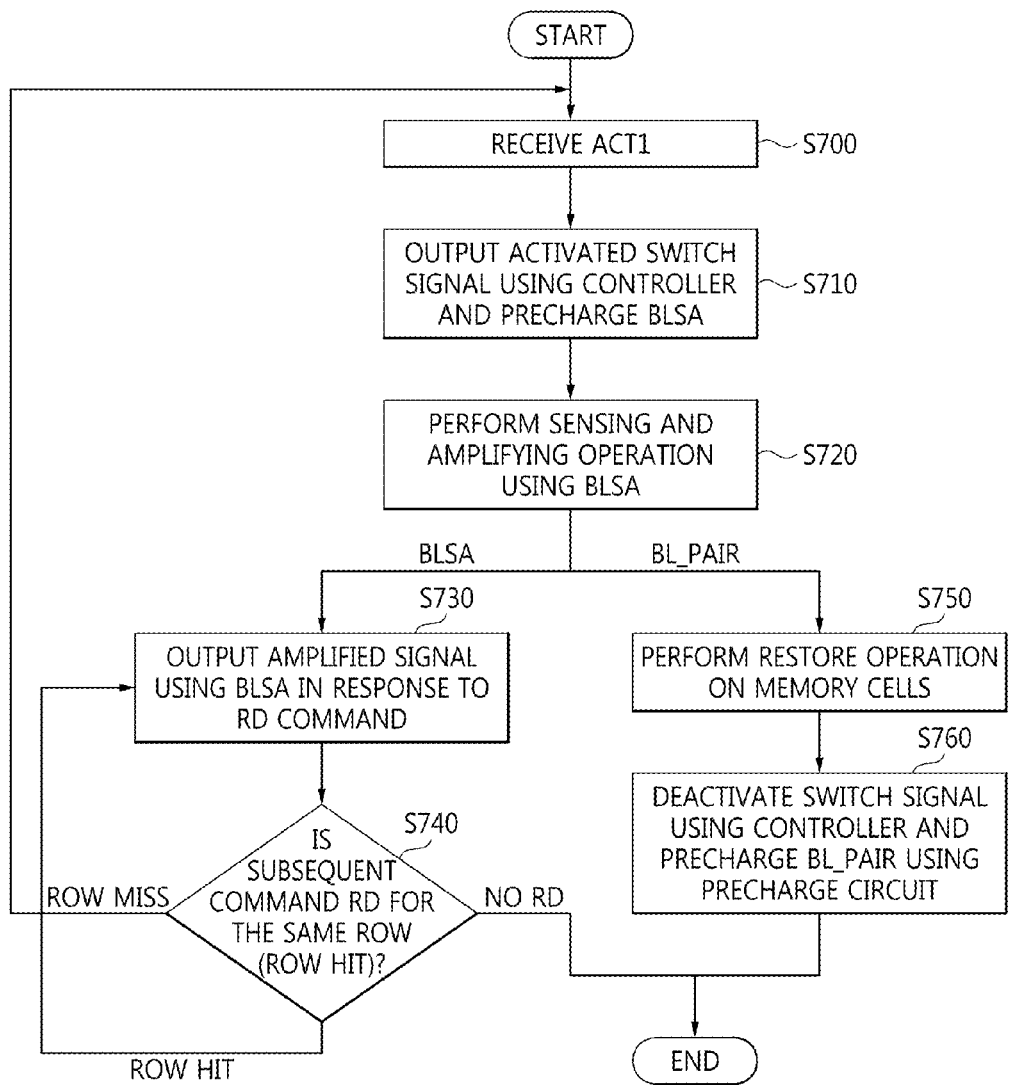
FIG. 7 is a flowchart of the read operation illustrated in FIGS. 4 and 5.

FIG. 7 is a flowchart of the read operation illustrated in FIGS. 4 and 5. Referring to FIGS. 1 through 5 and FIG. 7, while the precharge circuit 52 is precharging the bit line pair BL_PAIR, the control logic 20 and the controller 57 may receive the read active command ACT1 in operation S700.

The controller 57 may output the switch signal /ISO at the high level H in response to the read active command ACT1. The switch circuit 53 may connect the bit line pair BL_PAIR to the bit line sense amplifier BLSA in response to the switch signal /ISO at the high level H. Accordingly, the precharge circuit 52 may precharge the bit line sense amplifier BLSA in operation S710.

After the bit line sense amplifier BLSA is precharged, the precharge circuit 52 is disabled and the bit line sense amplifier BLSA is enabled. Accordingly, the bit line sense amplifier BLSA may sense and amplify data of memory cells in operation S720. The bit line sense amplifier BLSA may output an amplified signal to the I/O gate 61 in response to the read command RD in operation S730. A restore operation in which the data of the memory cells is restored may be performed in operation S750 in parallel with the output of the amplified signal to the I/O gate 61.

After the restore operation is completed, the controller 57 may output the switch signal /ISO at the low level L and the precharge circuit 52 may precharge the bit line pair BL_PAIR in operation S760. After operation S730, it is determined whether a row-hit occurs in operation S740. When it is determined that a row-hit occurs in operation S740, the bit line sense amplifier BLSA may output the amplified signal to the I/O gate 61 in operation S730.

When it is determined that a row-miss does not occur (i.e., when a row-miss occurs), the controller 57 may output the switch signal /ISO at the high level H in response to the read active command ACT1 so that the bit line sense amplifier BLSA may be precharged in operations S700 and S710.

Figure 8:
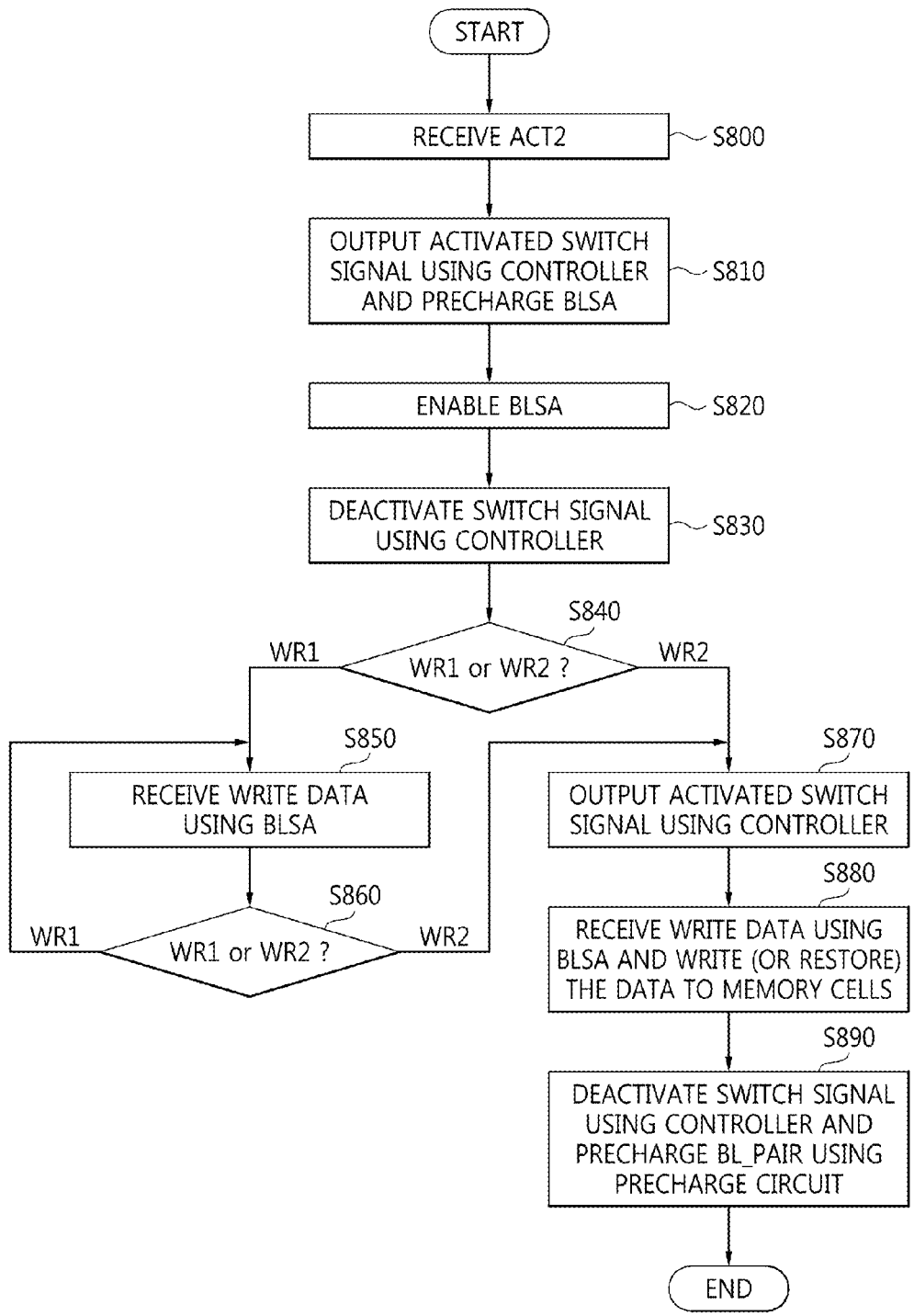
FIG. 8 is a flowchart of the write operation illustrated in FIG. 6.

FIG. 8 is a flowchart of the write operation illustrated in FIG. 6. Referring to FIGS. 1 through 3B and FIGS. 6 and 8, while the precharge circuit 52 is precharging the bit line pair BL_PAIR, the control logic 20 and the controller 57 may receive the write active command ACT2 in operation S800.

The controller 57 may output the switch signal /ISO at the high level H in response to the write active command ACT2. The switch circuit 53 may connect the bit line pair BL_PAIR to the bit line sense amplifier BLSA in response to the switch signal /ISO at the high level H. Accordingly, the precharge circuit 52 may precharge the bit line sense amplifier BLSA in operation S810. After the bit line sense amplifier BLSA is precharged, the precharge circuit 52 may be disabled and the bit line sense amplifier BLSA may be enabled in operation S820.

After the bit line sense amplifier BLSA is enabled, the controller 57 generates the switch signal /ISO at the low level L so that the bit line pair BL_PAIR is disconnected from the bit line sense amplifier BLSA in operation S830. The control logic 20 and the controller 57 receive a write command and it is determined if the write command is a WR1 or WR2 command in operation S840.

When it is determined that the write command is the first write command WR1 in operation S840, the switch signal /ISO is maintained at the low level L and the bit line sense amplifier BLSA may receive write data from the I/O gate 61 in operation S850. Since the bit line pair BL_PAIR has been disconnected from the bit line sense amplifier BLSA, the write data is not transmitted to the bit line pair BL_PAIR. In other words, when two first write commands WR1 are consecutively input, write data are sequentially transmitted to the bit line sense amplifier BLSA. It is determined whether the next write command is a WR1 or WR2 command in operation S860. When it is determined that the write command is a WR1 command in operation S860, the switch signal /ISO is maintained at the low level L and the bit line sense amplifier BLSA may receive write data from the I/O gate 61 in operation S850.

When it is determined that the write command is the second write command WR2 in operation S840 or 5860, the controller 57 may output the switch signal /ISO at the high level H so that the bit line pair BL_PAIR is connected to the bit line sense amplifier BLSA in operation S870. When the bit line sense amplifier BLSA receives write data from the I/O gate 61, the write data may be written to (or restored in) memory cells through the bit line pair BL_PAIR in operation S880. Thereafter, the controller 57 may output the switch signal /ISO at the low level L and the precharge circuit 52 may precharge the bit line pair BL_PAIR in operation S890.

Figure 9:
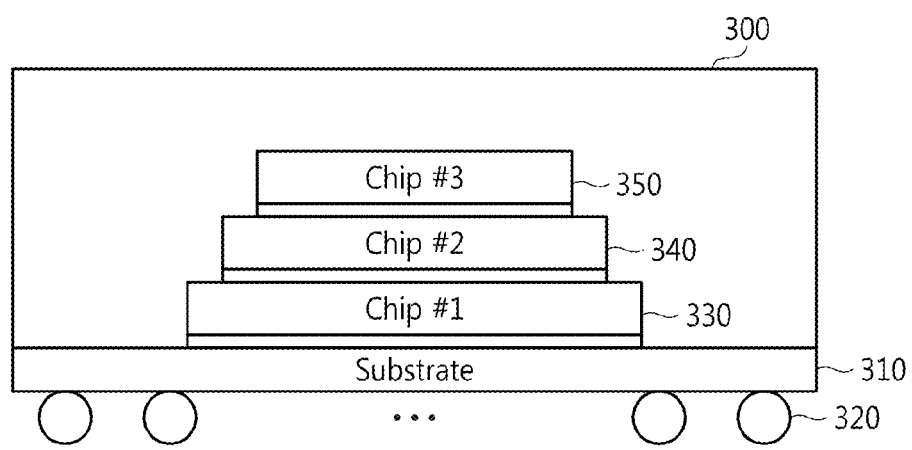
FIG. 9 is a conceptual diagram of a multi-chip package including the memory device illustrated in FIG. 1 according to some exemplary embodiments of the inventive concept.

FIG. 9 is a conceptual diagram of a multi-chip package including the memory device 10 illustrated in FIG. 1 according to some exemplary embodiments of the inventive concept. Referring to FIGS. 1 and 9, a multi-chip package 300 may include a plurality of semiconductor devices, e.g., Chip #1 330, Chip #2 340, and Chip #3 350, which are sequentially stacked on a package substrate 310. At least one of the semiconductor devices 330, 340, and 350 may include the memory device 10.

A memory controller (not shown) for controlling the operations of the semiconductor devices 330, 340, and 350 may be included within at least one of the semiconductor devices 330, 340, and 350 or may be implemented on the package substrate 310. A through-silicon via (TSV), a wire, or a bump may be used to electrically connect the semiconductor devices 330, 340, and 350 with one other. The multi-chip package 300 may include solder balls 320.

The first semiconductor device 330 may be a logic die including an I/O interface and a memory controller. Each of the second and third semiconductor devices 340 and 350 may include a stack of memory dies and each of the memory dies may include a memory cell array. A memory device of the second semiconductor device 340 and a memory device of the third semiconductor device 350 may be the same or different types of memory devices.

Alternatively, each of the first through third semiconductor devices 330, 340, and 350 may include a memory controller. The memory controller may be on the same die as a memory cell array or may be on a different die than the memory cell array.

As another alternative, the first semiconductor device 330 may include an optical interface. A memory controller may be positioned in the first or second semiconductor device 330 or 340 and a memory device may be positioned in the second or third semiconductor device 340 or 350. The memory device may be connected with the memory controller through TSVs.

Figure 10:
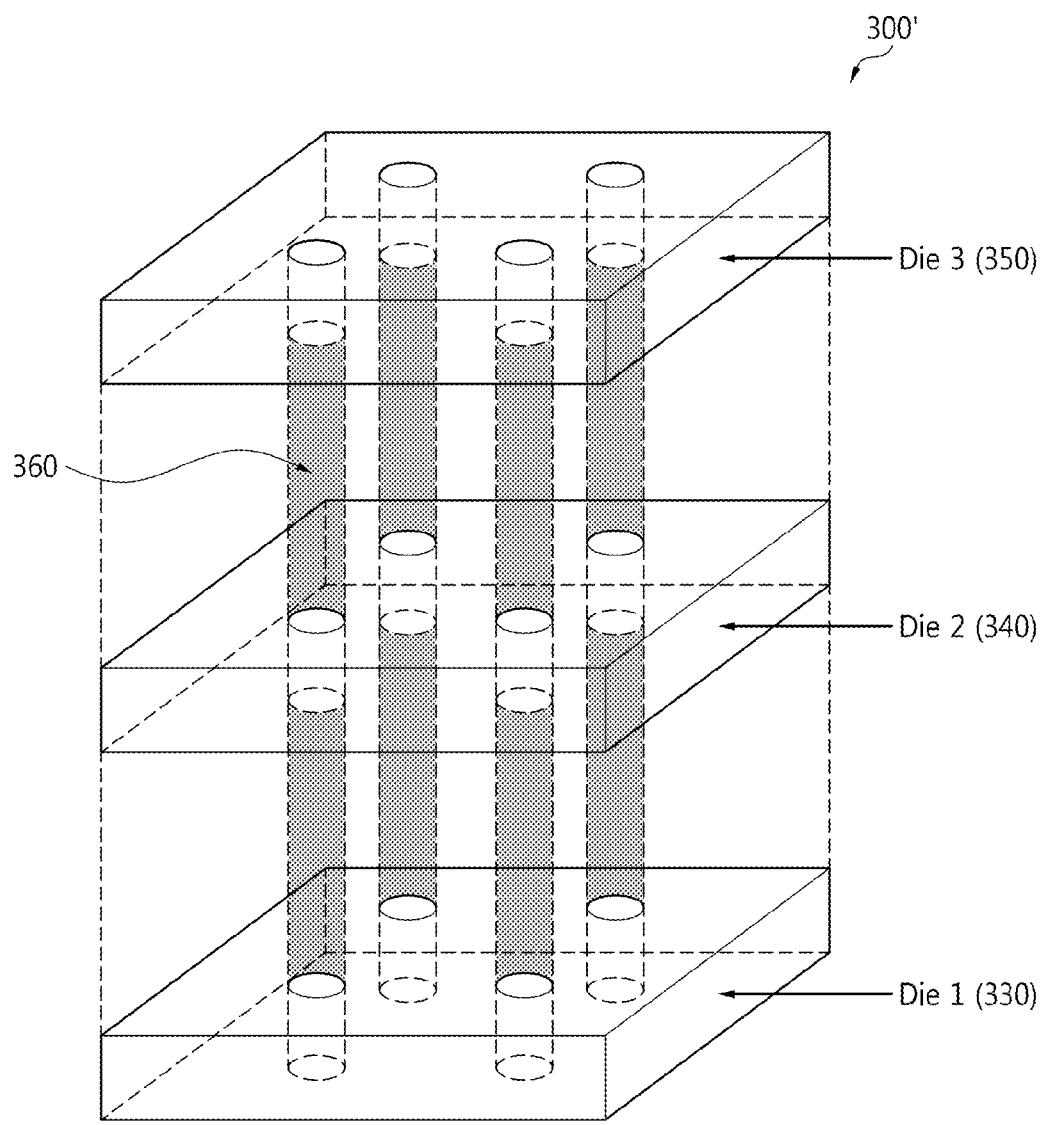
FIG. 10 is a three-dimensional conceptual diagram of the multi-chip package illustrated in FIG. 9 according to some exemplary embodiments of the inventive concept.

FIG. 10 is a three-dimensional conceptual diagram of the multi-chip package illustrated in FIG. 9 according to some exemplary embodiments of the inventive concept. Referring to FIGS. 1, 9, and 10, a multi-chip package 300' includes a plurality of the dies 330, 340, and 350 connected with one another through TSVs 360 in a stack structure. Each of the dies 330, 340, and 350 may include the memory device 10.

Figure 11:
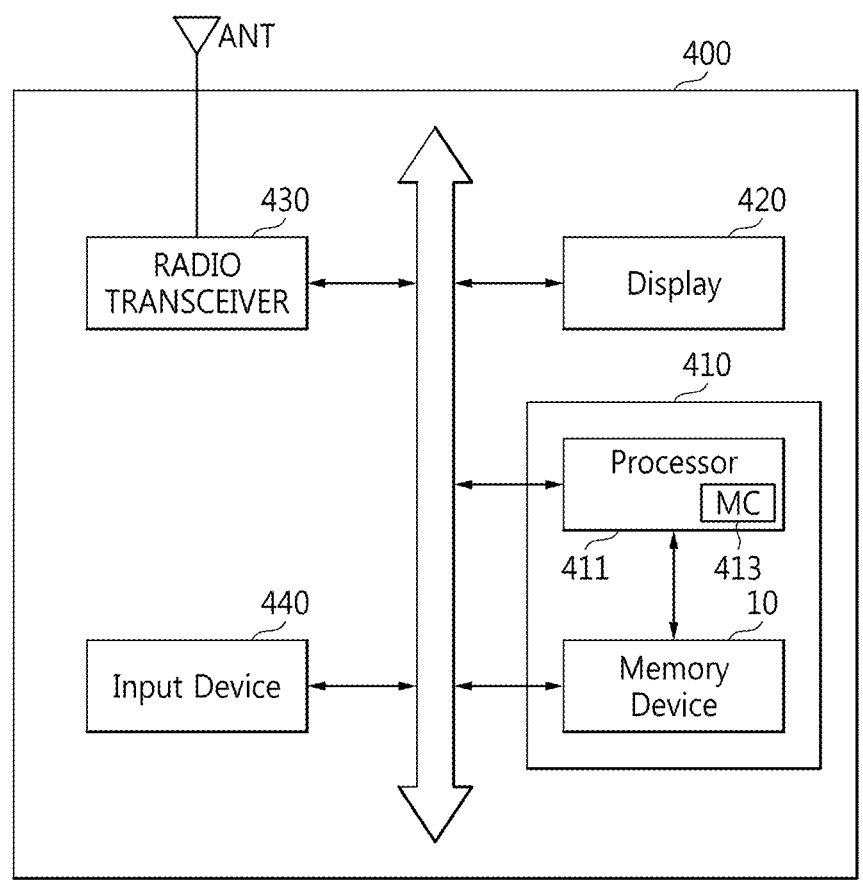
FIG. 11 is a diagram of a system including the memory device illustrated in FIG. 1 according to some exemplary embodiments of the inventive concept.

FIG. 11 is a diagram of a system including the memory device 10 illustrated in FIG. 1 according to some exemplary embodiments of the inventive concept. Referring to FIG. 1 and FIGS. 9 through 11, a system 400 may be implemented as a personal computer (PC) or a portable electronic device. The portable electronic device may be a laptop computer, a cellular phone, a smart phone, a tablet PC, a personal digital assistant (PDA), an enterprise digital assistant (EDA), a mobile internet device (MID), a portable multimedia player (PMP), a personal navigation device or portable navigation device (PND), a handheld game console, a wearable computer, an internet of things (IoT) device, or an internet of everything (IoE) device, etc.

The system 400 may include the memory device 10 and a processor 411. The memory device 10 and the processor 411 may be packaged into a package 410. The package 410 may be mounted on a system board (not shown). The package 410 may be the package 300 illustrated in FIG. 9 or the package 300' illustrated in FIG. 10.

The processor 411 may include a memory controller (MC) 413 that may control a data process operation, e.g., a write operation or a read operation, of the memory device 10. The MC 413 is controlled by the processor 411 that controls the overall operation of the system 400. In other exemplary embodiments, the MC 413 may be connected between the processor 411 and the memory device 10. Data stored in the memory device 10 may be displayed through a display 420 according to the control of the processor 411.

A radio transceiver 430 may transmit or receive radio signals through an antenna ANT. The radio transceiver 430 may convert radio signals received through the antenna ANT into signals that can be processed by the processor 411. The processor 411 may process the signals output from the radio transceiver 430 and store the processed signals in the memory device 10 or display the processed signals through the display 420. The radio transceiver 430 may also convert signals output from the processor 411 into radio signals and output the radio signals through the antenna ANT.

An input device 440 enables control signals for controlling the operation of the processor 411 or data to be processed by the processor 411 to be input to the system 400. The input device 440 may be implemented as a pointing device, such as a touch pad or a computer mouse; a keypad; or a keyboard.

The processor 411 may control the display 420 to display data output from the memory device 10, radio signals output from the radio transceiver 430, or data output from the input device 440. The MC 413 may be implemented as a part of the processor 411 or may be implemented in a chip separated from the processor 411.

Figure 12:
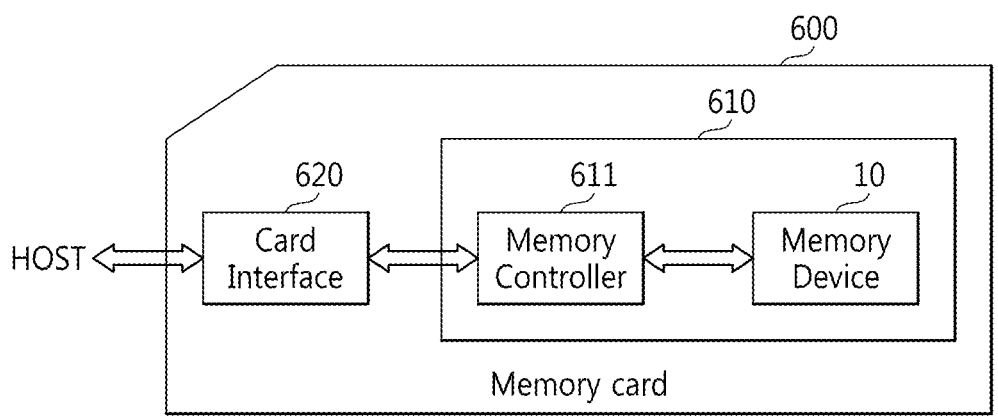
FIG. 12 is a diagram of a system including the memory device illustrated in FIG. 1 according to other exemplary embodiments of the inventive concept.

FIG. 12 is a diagram of a system including the memory device 10 illustrated in FIG. 1 according to other exemplary embodiments of the inventive concept. Referring to FIGS. 1, 9, 10, and 12, a system 600 may be implemented as a memory card or a smart card.

The system 600 may include the memory device 10, a memory controller 611, and a card interface 620. The memory device 10 and the memory controller 611 may be packaged into a package 610. The package 610 may be mounted on a system board (not shown). The package 610 may be the package 300 illustrated in FIG. 9 or the package 300' illustrated in FIG. 10.

The memory controller 611 may control data exchange between the memory device 10 and the card interface 620. The card interface 620 may be a secure digital (SD) card interface, a multi-media card (MMC) interface, or an embedded MMC (eMMC) interface, but the inventive concept is not restricted to these examples.

The card interface 620 may interface data between a host and the memory controller 611 according to a protocol of the host. When the system 600 is connected with the host and a portable electronic device, the host may transmit or receive data stored in the memory device 10 through the card interface 620 and the memory controller 611.

Figure 13:
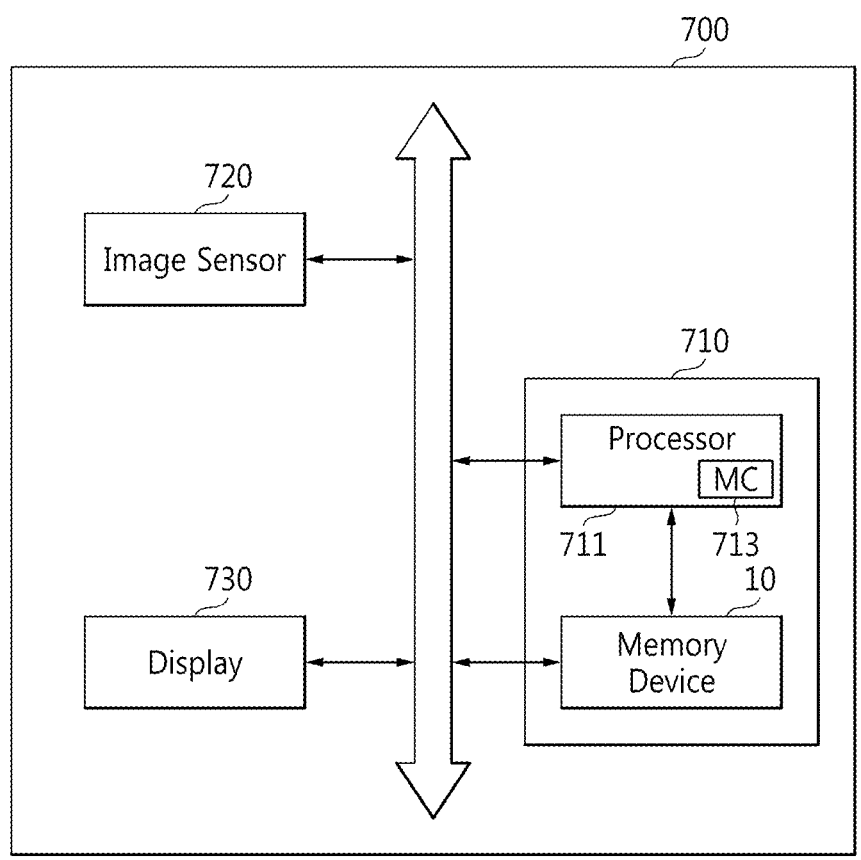
FIG. 13 is a diagram of a system including the memory device illustrated in FIG. 1 according to still other exemplary embodiments of the inventive concept.

FIG. 13 is a diagram of a system including the memory device 10 illustrated in FIG. 1 according to still other exemplary embodiments of the inventive concept. Referring to FIGS. 1, 9, 10, and 13, a system 700 may be implemented as an image processing system such as a digital camera or a portable electronic device equipped with a digital camera.

The system 700 may include a memory device 10, a processor 711, an MC 713, an image sensor 720, and a display 730. The memory device 10 and the processor 711 may be packaged into a package 710. The package 710 may be mounted on a system board (not shown). The package 710 may be the package 300 illustrated in FIG. 9 or the package 300' illustrated in FIG. 10.

The MC 713 may control the operation of the memory device 10. The MC 713 may be implemented as a part of the processor 711 or may be implemented in a chip separated from the processor 711.

The image sensor 720 may convert an optical image into a digital signal. The digital signal may be stored in the memory device 10 or displayed through the display 730 according to the control of the processor 711. The digital signal stored in the memory device 10 may be displayed through the display 730 according to the control of the processor 711.

Figure 14:
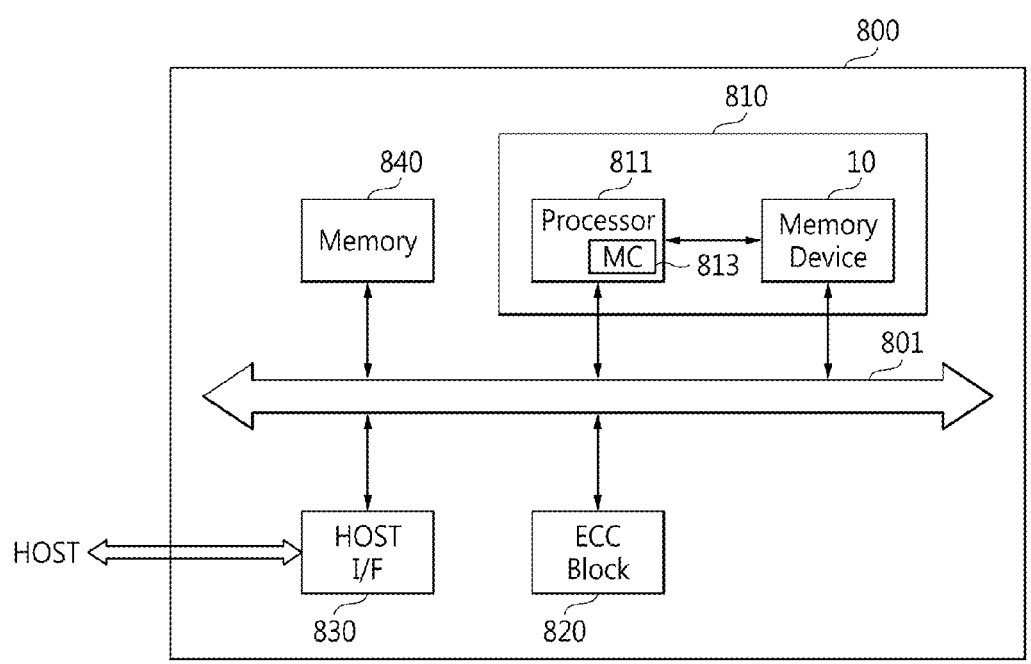
FIG. 14 is a diagram of a system including the memory device illustrated in FIG. 1 according to even other exemplary embodiments of the inventive concept.

FIG. 14 is a diagram of a system including the memory device 10 illustrated in FIG. 1 according to even other exemplary embodiments of the inventive concept. Referring to FIGS. 1, 9, 10, and 14, a system 800 may include the memory device 10 and a processor 811 controlling the overall operation of the system 800. The system 800 may be implemented as a portable electronic device.

The memory device 10 and the processor 811 may be packaged into a package 810. The package 810 may be mounted on a system board (not shown). The package 810 may be the package 300 illustrated in FIG. 9 or the package 300' illustrated in FIG. 10. The processor 811 may include an MC 813 controlling the operation of the memory device 10. The system 800 may also include a memory 840 that may be used as an operation memory of the processor 811. The memory 840 may be formed with non-volatile memory or volatile memory.

A host connected with the system 800 may transmit or receive data with the memory device 10 through the processor 811 and a host interface (I/F) 830. At this time, the MC 813 may function as a memory I/F.

The system 800 may also include an error correction code (ECC) block 820. The ECC block 820 is controlled by the processor 811. The ECC block 820 may detect and correct an error bit in data output from the memory device 10 through the MC 813 and may transmit error-corrected data to the host through the host interface 830.

The processor 811 may control data exchange among the ECC block 820, the host OF 830, and the memory 840 through a bus 801. The system 800 may be implemented as a flash memory drive, a universal serial bus (USB) memory drive, an interchip (IC)-USB memory drive, or a memory stick.

Figure 15:
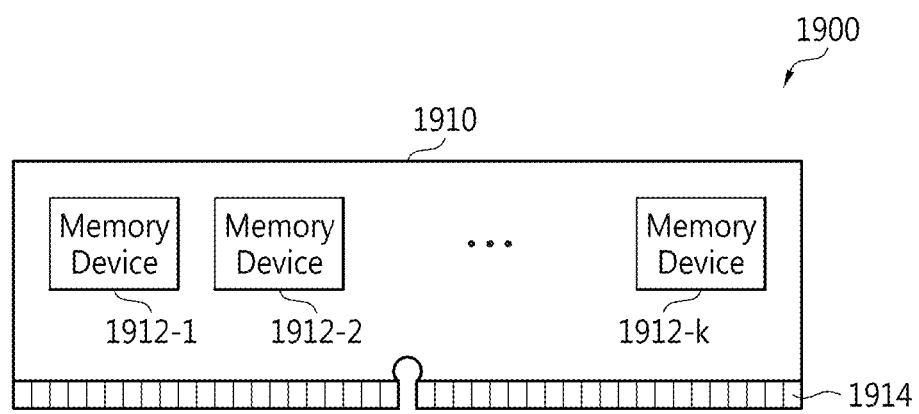
FIG. 15 is a diagram of a system including the memory device illustrated in FIG. 1 according to yet other exemplary embodiments of the inventive concept.

FIG. 15 is a diagram of a system including the memory device 10 illustrated in FIG. 1 according to yet other exemplary embodiments of the inventive concept. Referring to FIGS. 1 and 15, a system 1900, e.g., a memory module, may include memory devices 1912-1 through 1912-$k$ (where "k" is a natural number of at least 2) mounted on a printed circuit board (PCB) 1910. The PCB 1910 may include connection pins 1914. Each of the memory devices 1912-1 through 1912-$k$ may be the memory device 10 illustrated in FIG. 1.

The memory module may be a single in-line memory module (SIMM), a dual in-line memory module (DIMM), a load reduction DIMM (LRDIMM), a fully buffered optical DIMM (FBDIMM), an unregistered DIMM (UDIMM), a registered DIMM (RDIMM), or a small outline DIMM (SO-DIMM), etc.

Figure 16:
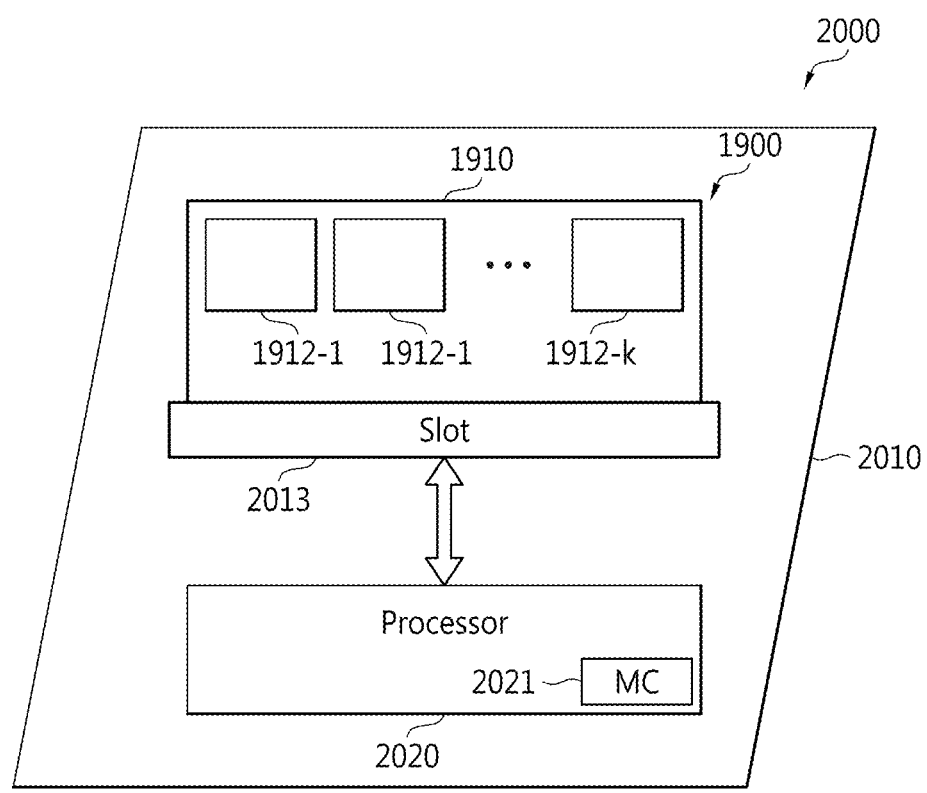
FIG. 16 is a diagram of a system including the memory device illustrated in FIG. 1 according to further exemplary embodiments of the inventive concept.

FIG. 16 is a diagram of a system including the memory device 10 illustrated in FIG. 1 according to further exemplary embodiments of the inventive concept. Referring to FIGS. 1, 15, and 16, a system 2000 may be implemented as a PC, a laptop computer, or a server.

The system 2000 includes a memory module slot 2013 mounted on a main board 2010 and a processor 2020. The memory module slot 2013 may be configured to receive the memory module 1900 of FIG. 15. Each of the memory devices 1912-1 through 1912-$k$ in the memory module 1900 may communicate data with the processor 2020 through the memory module slot 2013, the connection pins 1914, and the main board 2010. Each of the memory devices 1912-1 through 1912-$k$ may be the memory device 10 illustrated in FIG. 1. The processor 2020 may be a chip set. The processor 2020 may include an MC 2021 that controls the memory devices 1912-1 through 1912-$k$.

Figure 17:
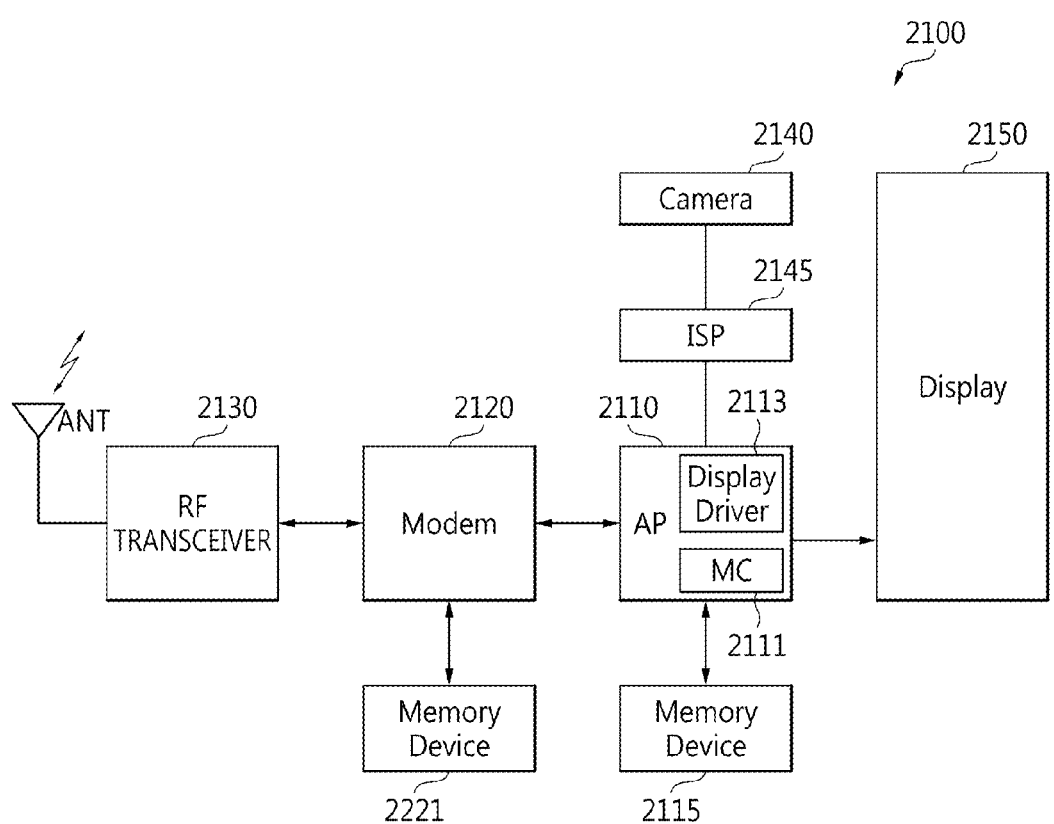
FIG. 17 is a diagram of a system including the memory device illustrated in FIG. 1 according to still further exemplary embodiments of the inventive concept.

FIG. 17 is a diagram of a system including the memory device 10 illustrated in FIG. 1 according to still further exemplary embodiments of the inventive concept. Referring to FIGS. 1 and 17, a system 2100 may be implemented as a mobile computing device. The mobile computing device may be a portable electronic device.

The mobile device 2100 may include an application processor (AP) 2110, an antenna ANT, a radio frequency (RF) transceiver 2130, a modem 2120, a memory device 2221, a memory device 2115, an image signal processor (ISP) 2145, a camera 2140, and a display 2150. An application processor (AP) 2110 may include a memory controller (MC) 2111 and may control the operation of each of the memory device 2115, the modem 2120, the ISP 2145, and the display 2150. The AP 2110 may be implemented as a system on chip (SoC). Each of the memory devices 2115 and 2221 may be the memory device 10 illustrated in FIG. 1.

The MC 2111 included in the AP 2110 may control an access to the memory device 2115. A display driver 2113 included in the AP 2110 may control the operation of the display 2150. The modem 2120 may interface data between a radio frequency (RF) transceiver 2130 and the AP 2110. Data processed by the modem 2120 may be stored in the memory device 2221 or may be transmitted to the AP 2110.

Radio data received through an antenna ANT may be transmitted to the modem 2120 through the RF transceiver 2130. Data output from the modem 2120 may be converted into radio data by the RF transceiver 2130 and the radio data may be output through the antenna ANT. The image signal processor (ISP) 2145 may process a signal output from a camera (or an image sensor) 2140 and may transmit processed data to the AP 2110.

As described above, according to some exemplary embodiments of the inventive concept, a memory device decouples an operation of a bit line pair from an operation of a bit line sense amplifier, so that the memory device reads or writes data while precharging the bit line pair, thereby reducing a precharge time. In addition, a memory controller in the memory device does not need to predict a row-hit or a row-miss, so that the memory device performs an optimal page management policy. As a result, the performance of the memory device is increased.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A memory device including:
   a first memory cell connected to a first bit line;
   a second memory cell connected to a second bit line;
   a precharge circuit connected between the first bit line and the second bit line;
   a sense amplifier including a first input terminal and a second input terminal;
   a switch circuit connected to the first bit line and the first input terminal and to the second bit line and the second input terminal, the switch circuit configured to control a connection between the first bit line and the first input terminal and a connection between the second bit line and the second input terminal in response to a switch signal; and
   a controller configured to generate the switch signal in response to a command.

2. The memory device of claim 1, wherein when a read active command for a read operation is received while the precharge circuit is performing a precharging operation on the first bit line and the second bit line,
   the controller generates an activated switch signal as the switch signal and outputs the activated switch signal in response to the read active command;
   the sense amplifier amplifies a difference between a voltage of the first bit line and a voltage of the second bit line in response to a sense amplifier enable signal after the precharging operation is completed;
   the memory device performs a restore operation on the first memory cell and the second memory cell while an amplified signal is being output;
   the controller generates a deactivated switch signal as the switch signal and outputs the deactivated switch signal after the restore operation is completed; and
   the precharge circuit performs the precharging operation.

3. The memory device of claim 1, wherein when a write active command for a write operation is received while the precharge circuit is performing a precharging operation on the first bit line and the second bit line,
   the controller generates an activated switch signal as the switch signal and outputs the activated switch signal in response to the write active command; and
   the sense amplifier receives write data according to a write command while being enabled in response to a sense amplifier enable signal after the precharge operation is completed.

4. The memory device of claim 3, wherein the controller generates a deactivated switch signal as the switch signal and outputs the deactivated switch signal after the precharge operation is completed and the controller maintains the switch signal deactivated when the write command is a first write command for a first row and a subsequent command is a second write command for the first row.

5. The memory device of claim 3, wherein the controller generates a deactivated switch signal as the switch signal and outputs the deactivated switch signal after the precharge operation is completed, the controller outputs the activated switch signal in response to a first write command when the write command is the first write command for a first row and a subsequent command is not a second write command for the first row, the memory device performs a restore operation on the first memory cell and the second memory cell, the controller generates a deactivated switch signal as the switch signal and outputs the deactivated switch signal after the restore operation is completed, and the precharge circuit performs the precharging operation.

6. The memory device of claim 1, wherein the memory device is dynamic random access memory (DRAM).

7. The memory device of claim 2, wherein the activated switch signal is a high level, and the deactivated switch signal is a low level.

8. A memory module including:
   a printed circuit board (PCB) including a connection pin; and
   a memory device mounted on the PCB,
   wherein the memory device includes:
      a first memory cell connected to a first bit line;
      a second memory cell connected to a second bit line;
      a precharge circuit connected between the first bit line and the second bit line;
      a sense amplifier including a first input terminal and a second input terminal;
      a switch circuit connected to the first bit line and the first input terminal and to the second bit line and the second input terminal, the switch circuit configured to control a connection between the first bit line and the first input terminal and a connection between the second bit line and the second input terminal in response to a switch signal; and
      a controller configured to generate the switch signal in response to a command input to the memory device through the connection pin.

9. The memory module of claim 7, wherein when a read active command for a read operation is received while the precharge circuit is performing a precharging operation on the first bit line and the second bit line,
   the controller generates an activated switch signal as the switch signal and outputs the activated switch signal in response to the read active command;
   the sense amplifier amplifies a difference between a voltage of the first bit line and a voltage of the second bit line in response to a sense amplifier enable signal after the precharging operation is completed;
   the memory device performs a restore operation on the first memory cell and the second memory cell while an amplified signal is being output;
   the controller generates a deactivated switch signal as the switch signal and outputs the deactivated switch signal after the restore operation is completed; and
   the precharge circuit performs the precharging operation.

10. The memory module of claim 8, wherein when a write active command for a write operation is received while the precharge circuit is performing a precharging operation on the first bit line and the second bit line, the controller generates an activated switch signal as the switch signal and outputs the activated switch signal in response to the write active command; and the sense amplifier receives write data according to a write command while being enabled in response to a sense amplifier enable signal after the precharge operation is completed.

11. The memory module of claim 10, wherein the controller generates a deactivated switch signal as the switch signal and outputs the deactivated switch signal after the precharge operation is completed and the controller maintains the deactivated switch signal when the write command is a first write command for a first row and a subsequent command is a second write command for the first row.

12. The memory module of claim 10, wherein the controller generates a deactivated switch signal as the switch signal and outputs the deactivated switch signal after the precharge operation is completed, the controller outputs the activated switch signal in response to a first write command when the write command is the first write command for a first row and a subsequent command is not a second write command for the first row, the memory device performs a restore operation on the first memory cell and the second memory cell, the controller generates a deactivated switch signal as the switch signal and outputs the deactivated switch signal after the restore operation is completed, and the precharge circuit performs the precharging operation.

13. The memory module of claim 8, wherein the memory module is one of a single in-line memory module (SIMM), a dual in-line memory module (DIMM), a load reduction DIMM (LRDIMM), a fully buffered optical DIMM (FB-DIMM), an unregistered DIMM (UDIMM), a registered DIMM (RDIMM), or a small outline DIMM (SO-DIMM).

14. A computing system including:
the memory module of claim 8;
a memory module slot electrically connected with the memory module; and
a processor electrically connected with the memory module slot,
wherein the processor includes a memory controller configured to control an operation of the memory device.

15. The computing system of claim 14, wherein the computing system is a personal computer or a laptop computer.

16. The memory module of claim 9, wherein the activated switch signal is a high level, and the deactivated switch signal is a low level.

* * * * *